(12) United States Patent
Helvaci et al.

(10) Patent No.: US 10,018,060 B2
(45) Date of Patent: Jul. 10, 2018

(54) METHOD OF DESIGNING GUIDE VANE FORMATIONS

(71) Applicant: ROLLS-ROYCE PLC, London (GB)

(72) Inventors: Caner Hasan Helvaci, Derby (GB); Brian Guy Cooper, Derby (GB)

(73) Assignee: ROLLS-ROYCE plc, London (GB)

( * ) Notice: Subject to any disclaimer, the term of this patent is extended or adjusted under 35 U.S.C. 154(b) by 574 days.

(21) Appl. No.: 14/661,805

(22) Filed: Mar. 18, 2015

(65) Prior Publication Data

US 2015/0300185 A1    Oct. 22, 2015

(30) Foreign Application Priority Data

Apr. 16, 2014    (GB) .................................. 1406822.5

(51) Int. Cl.
*F01D 9/04*    (2006.01)
*G06F 17/50*    (2006.01)

(52) U.S. Cl.
CPC ......... *F01D 9/041* (2013.01); *G06F 17/5086* (2013.01); *F05D 2220/32* (2013.01); *F05D 2230/10* (2013.01); *F05D 2240/129* (2013.01)

(58) Field of Classification Search
CPC ... F01D 9/02; F01D 9/04; F01D 9/041; F01D 9/047; G06F 17/5086; F05D 2220/32; F05D 2230/10; F05D 2240/11; F05D 2240/12; F05D 2240/129; F05D 2250/30; F05D 2250/31; F05D 2250/311; F05D 2250/312; F05D 2250/313; F05D 2250/314; F05D 2250/315; F05D 2250/70; F05D 2250/71; F05D 2250/711; F05D 2250/712; F05D 2250/713; F05D 2250/72; F05D 2250/73; Y10T 29/49323
See application file for complete search history.

(56) References Cited

U.S. PATENT DOCUMENTS

| 5,839,878 | A | * | 11/1998 | Maier | ..................... F01D 9/042 415/191 |
|---|---|---|---|---|---|
| 6,672,832 | B2 | * | 1/2004 | Leeke | ..................... F01D 5/143 415/191 |
| 7,134,842 | B2 | * | 11/2006 | Tam | ........................ F01D 5/143 416/193 A |

(Continued)

FOREIGN PATENT DOCUMENTS

EP    1 908 924 A2    4/2008

OTHER PUBLICATIONS

Jun. 23, 2016 Partial Search Report issued in European Patent Application No. 15159547.

(Continued)

*Primary Examiner* — Jason Shanske
*Assistant Examiner* — Alexander White
(74) *Attorney, Agent, or Firm* — Oliff PLC (57) ABSTRACT

A computer-based method of designing a guide vane formation is provided. The vane formation is for use in a gas turbine engine which has a cascade of circumferentially arranged identical guide vane formations. The vane formation has radially inner and radially outer chordal seals. The method allows the elimination of "saw-tooth" leakage gaps between inner chordal seals of neighboring vane formations and between outer chordal seals of neighboring vane formations even when the inner and outer chordal seals are axially offset from each other.

12 Claims, 9 Drawing Sheets

(56) References Cited

U.S. PATENT DOCUMENTS

| | | | |
|---|---|---|---|
| 7,195,454 B2* | 3/2007 | Lu | F01D 5/143 |
| | | | 415/181 |
| 7,220,100 B2* | 5/2007 | Lee | F01D 5/143 |
| | | | 415/191 |
| 7,384,243 B2* | 6/2008 | Noshi | F01D 5/141 |
| | | | 416/223 A |
| 2005/0244267 A1* | 11/2005 | Coign | F01D 9/023 |
| | | | 415/189 |
| 2009/0038311 A1* | 2/2009 | Snook | F01D 9/042 |
| | | | 60/747 |
| 2009/0110479 A1 | 4/2009 | Harter et al. | |
| 2010/0204814 A1* | 8/2010 | Neumaier | G05B 19/40937 |
| | | | 700/97 |

OTHER PUBLICATIONS

Feb. 5, 2015 Search Report issued in British Application No. 1406822.5.

\* cited by examiner

METHOD OF DESIGNING GUIDE VANE FORMATIONS

FIELD OF THE INVENTION

The present invention relates to a method of designing guide vane formations, such as gas turbine engine nozzle guide vane formations.

BACKGROUND OF THE INVENTION

Control of fluid flows through a gas turbine engine is important to achieve efficiency and performance. Guide vanes are utilised in order to direct and present gas flows generated by the compressor and turbine stages of an engine. These vanes generally act between the stages of the engine. For example, a cascade of high-pressure turbine (HPT) nozzle guide vanes (NGVs) directs and guides the working gas flow from the combustor to the high pressure turbine.

Figure 1:
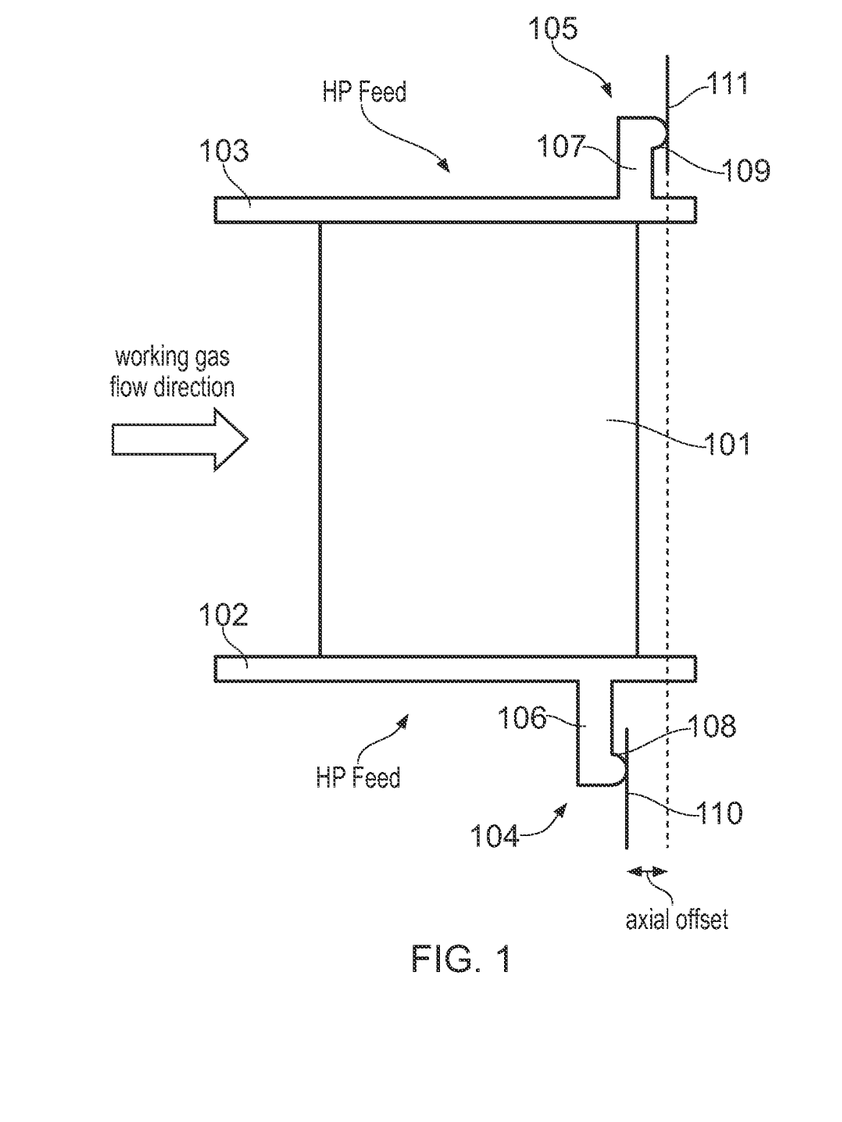
FIG. 1 shows schematically a side view of an high-pressure turbine nozzle guide vane formation.

FIG. 1 shows schematically a side view of an HPT NGV formation. The NGV formation has one or more aerofoil bodies 101 which span the working gas annulus of the engine, the direction of flow of the working gas being indicated. At radially inner and outer ends of the aerofoil bodies, the vane formation has respectively inner 102 and outer 103 platforms. The inner platforms of the cascade of vanes form an inner wall of the working gas annulus, while the outer platforms form an outer wall of the annulus. Conventionally HPT NGV formations are cooled internally with air which is fed from the high pressure compressor exit and passes through the inner and outer platforms to enter the ends of the aerofoil bodies, as shown in FIG. 1. The cooling air can eventually exit the aerofoil body through cooling holes formed in the aerofoil surfaces (where it can also provide surface film cooling) or air exits at the trailing edge of the aerofoil body.

The high-pressure cooling air is sealed from the annulus gas path by inner 104 and outer 105 chordal seals. Each chordal seal has a rail 106, 107 which projects from the respective platform 102, 103 and forms a respective contact face 108, 109 which sealingly contacts along a line with a corresponding contact face 110, 111 of inner and outer support rings of the engine. The chordal seal contact faces lie on prismatic surfaces (which may be cylindrical, as shown in FIG. 1, although other shaped surfaces are possible) while the support ring contact faces are essentially planar. Each chordal seal extends in a straight line between the circumferentially spaced side faces of the respective platform. The chordal seals 104, 105 act as mechanical restraints to react the axial gas loads, whilst allowing the NGV to articulate or pivot at the seals to compensate for differential axial thermal expansion effect without losing contact at the sealing faces.

Figure 2:
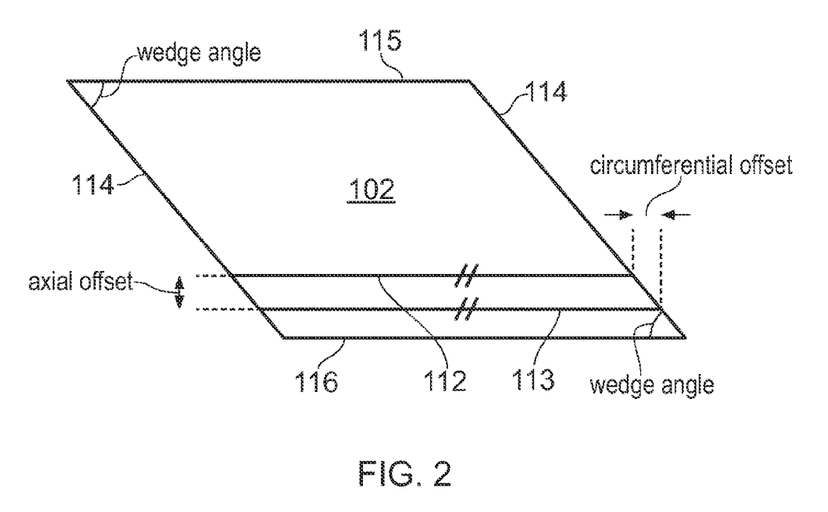
FIG. 2 shows schematically a plan view of the inner platform of the nozzle guide vane formation of FIG. 1.

In order to allow the NGV formations to articulate without losing contact at the contact faces 110, 111 the inner 112 and outer 113 contact lines of the chordal seals 104, 105 on the inner and outer support rings must be parallel, as shown in FIG. 2 by the projections of the contact lines 112, 113 onto the schematic plan view of the inner platform 102 of the NGV formation of FIG. 1, and the double line marks on each of these lines. However, due to engine design constraints, it is often not possible to have the chordal seals 104, 105 in the same axial position. An axial offset between the inner 112 and outer 113 contact lines then results.

In addition, each platform 102, 103 has an acute wedge angle between each side face 114 of the platform and the front 115 or rear 116 face of the platform. This angle is needed so that the intersection of the aerofoil bodies 101 with the inner and outer walls of the working gas annulus lies entirely within the platforms (i.e. the aerofoil bodies do not overhang the side faces of the platforms).

The net effect of these constraints is that there is typically a circumferential misalignment between the inner 112 and outer 113 contact lines, as shown in FIG. 2.

Desirably, the contact line of one chordal seal with its support ring ends at the same position that the contact line for the circumferentially adjacent chordal seal with that support ring begins. In this way, the contact lines with a given support ring can link up in a polygonal shape in which neighbouring chordal seals meet at "polygon corners". This arrangement helps to reduce leakage around the ends of the chordal seal.

Figure 3:
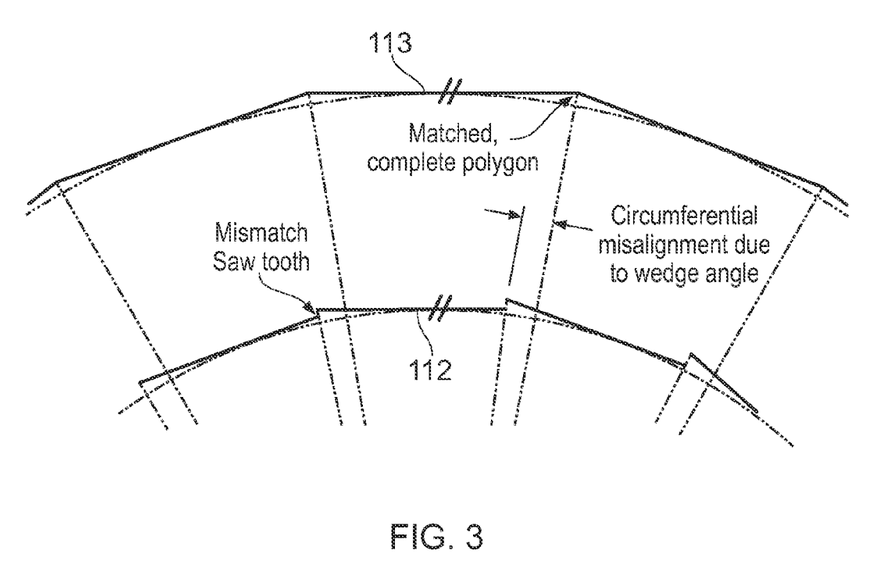
FIG. 3 shows schematically a view from the front of chordal seal contact lines for neighbouring nozzle guide vane formations of FIG. 1.

Typically, however, such linking up is only achieved for at most one of the inner and outer polygons, and "saw-tooth" leakage gaps result at the ends of the chordal seals of the other polygon as a result of the circumferential offset, as shown in FIG. 3. The leakage through this "saw-tooth" gap can be extremely penalising to turbine efficiency due the large pressure differential across the seal. The total area of all the gaps for a cascade of NGV formations can depend on a number of factors, but may be in excess of 50 mm$^2$.

SUMMARY OF THE INVENTION

The present invention is at least partly based on a realisation that it is possible to design guide vane formations in which the "saw-tooth" leakage gap can be eliminated for both the inner and outer polygons, even when the inner and outer chordal seals are axially offset from each other.

Accordingly, in a first aspect, the present invention provides a computer-based method of designing a guide vane formation for use in a gas turbine engine which has a cascade of circumferentially arranged identical guide vane formations, and which further has radially inner and radially outer support rings for the guide vane formations, each vane formation including radially inner and outer platforms which define the gas annulus of the engine, each vane formation further including one or more aerofoil bodies which each spans the platforms, the inner and the outer platforms of each vane formation having respective inner and outer chordal seals which each extend in a straight line between circumferentially spaced side faces of the respective platform, the inner and outer chordal seals of each vane formation making respective sealing contact with the inner and outer support rings such that the vane formation can pivot at the inner and outer chordal seals while maintaining the sealing contacts, wherein the method includes the steps of:

(i) selecting relative axial positions of the inner and outer chordal seals such that the inner chordal seals of the vane formations lie in one normal plane to the engine centre line, and the outer chordal seals of the vane formations lie in another normal plane to the engine centre line;

(ii) selecting radial heights of the inner and outer chordal seals, each radial height being the distance of closest radial approach of the respective chordal seal to the engine centre line;

(iii) defining inner and outer radial datum points for the inner and outer chordal seals, each radial datum point being on the respective normal plane and being at the respective radial height, and the inner and outer radial datum points being on a common plane which also contains the engine centre line;

(iv) defining a conical surface which is coaxial with the engine centre line, and which has a cone angle which determines the acute wedge angle formed on the gas-washed surface of each platform between a side face of that platform and the front or rear face of that platform, the apex of the conical surface being positioned such that it is co-linear with the inner and outer radial datum points;

(v) defining two segment planes which both contain the engine centre line and which have an angle between them measured around the centre line which is equal to 360° divided by the number of vane formations in the cascade;

(vi) defining two wedge chock planes which are each perpendicular to a respective segment plane and are each tangential to the conical surface, the side faces of the inner and outer platforms on the suction side of the aerofoil bodies of a vane formation lying in one of the wedge chock planes, and the side faces of the inner and outer platforms on the pressure side of the aerofoil bodies of the same vane formation lying in the other wedge chock plane; and (vii) defining, in the normal plane of a first one of the inner and outer chordal seals, (a) an arc of a circle which is centred on the engine centre line and contains the respective radial datum point, and (b) a tangent line to the arc such that the intersections of the tangent line with the wedge chock planes are at equal radial distances from the engine centre line, whereby the tangent line is the straight line of the first chordal seal, and whereby the straight line of the second chordal seal lies on the other normal plane, is parallel to the straight line of the first chordal seal and provides the radial height of the second chordal seal.

In this way, the contact lines of both the inner and outer chordal seal with their support rings can be made to link up in polygonal shapes with no "saw-tooth" leakage gaps. Substantial engine efficiency improvements (e.g. of the order of −0.1% of specific fuel consumption) can thus be obtained. In particular, the method allows the elimination of the "saw-tooth" leakage gaps even when the inner and outer chordal seals are axially offset from each other (i.e. the normal planes are axially offset from each other).

In step (iv), the cone angle determines the acute wedge angle formed on the gas-washed surface of each platform between a side face of that platform and the front or rear face of that platform. In general, the cone half angle (i.e. the angle between the engine centre line and a line in the conical surface which passes through the apex) may have approximately, but not exactly, the same value as that of the acute wedge angle.

The method may further include the step after step (v) of: rotating the two segment planes about the engine centre line, the rotation preserving the angle between the segment planes and resulting in a corresponding rotation of the two wedge chock planes. In this way the angular positions of the side faces of the platforms of a vane formation can be adjusted relative to the angular positions of the aerofoil bodies of that vane formation.

In a second aspect, the present invention provides a method of producing a guide vane formation for use in a gas turbine engine which has a cascade of circumferentially arranged identical guide vane formations, and which further has radially inner and radially outer support rings for the guide vane formations, each vane formation including radially inner and outer platforms which define the gas annulus of the engine, each vane formation further including one or more aerofoil bodies which each spans the platforms, the inner and the outer platforms of each vane formation having respective inner and outer chordal seals which each extend in a straight line between circumferentially spaced side faces of the respective platform, the inner and outer chordal seals of each vane formation making respective sealing contacts with the inner and outer support rings such that the vane formation can pivot at the inner and outer chordal seals while maintaining the sealing contacts, wherein the method includes the steps of:

performing the method of the first aspect; and forming the guide vane formation with the platform side faces and chordal seals as designed according to that method.

In the second aspect, the platform side faces and chordal seals are designed before the guide vane formation is formed. However, an alternative approach is to start with a guide vane formation which is partially manufactured, and then to finish the guide vane formation using the approach of the present invention. In particular, a partially manufactured guide vane formation may already have radially inner and outer platforms, one or more aerofoil bodies, and inner and outer chordal seals, but the inner and outer platforms may be oversized in the circumferential direction, meaning their side faces are at provisional positions and there is still an opportunity to finish machine them to final positions. This opportunity can be used to reduce or eliminate sawtooth leakage gaps in existing engine designs where parameters such as the positions of the chordal seals cannot be altered.

Accordingly, in a third aspect, the present invention provides a method of producing a guide vane formation for use in a gas turbine engine which has a cascade of circumferentially arranged identical guide vane formations, and which further has radially inner and radially outer support rings for the guide vane formations, wherein the method includes the steps of:

(i) providing a guide vane formation which includes radially inner and outer platforms which define the gas annulus of the engine, and one or more aerofoil bodies which each spans the platforms, the inner and the outer platforms of each vane formation having respective inner and outer chordal seals which each extend in a straight line between circumferentially spaced provisional side faces of the respective platform, in use the inner and outer chordal seals of each vane formation making respective sealing contact with the inner and outer support rings such that the vane formation can pivot at the inner and outer chordal seals while maintaining the sealing contacts, the inner and outer chordal seals having: (a) relative axial positions such that the inner chordal seals of the vane formations lie in one normal plane to the engine centre line, and the outer chordal seals of the vane formations lie in another normal plane to the engine centre line, (b) radial heights, each radial height being the distance of closest radial approach of the respective chordal seal to the engine centre line, and (c) inner and outer radial datum points, each radial datum point being on the respective normal plane and being at the respective radial height, and the inner and outer radial datum points being on a common plane which also contains the engine centre line;

(ii) defining a conical surface which is coaxial with the engine centre line, and which has a cone angle which determines the acute wedge angle formed on the gas-washed surface of each platform between the final position of a side face of that platform and the front or rear face of that platform, the apex of the conical surface being positioned such that it is co-linear with the inner and outer radial datum points;

(iii) defining two segment planes which both contain the engine centre line and which have an angle between them measured around the centre line which is equal to 360° divided by the number of vane formations in the cascade;

(iv) defining two wedge chock planes which are each perpendicular to a respective segment plane and are each tangential to the conical surface, the final positions of the side faces of the inner and outer platforms on the suction side of the aerofoil bodies of the vane formation lying in one of the wedge chock planes, and the final positions of the side faces of the inner and outer platforms on the pressure side of the aerofoil bodies of the vane formation lying in the other wedge chock plane;

(v) rotating the segment planes about the engine centre line, the rotation preserving the angle between the segment planes, in order to adjust the positions of the wedge chock planes and the corresponding final positions of the side faces such that sawtooth leakage gaps of the inner and outer chordal seals are reduced or eliminated; and (vi) machining the provisional side faces of the guide vane formation to produce finished side faces at the final positions.

In step (i) the values of the parameters of the inner and outer chordal seals referred to at (a) to (c) are preferably measured values rather than nominal design values. Indeed, the method may include additional steps (I) and (II) between steps (i) and (ii) of: (I) measuring the position of the normal plane of the inner chordal seals, the position of the normal plane of the outer chordal seals, and the radial heights; and (II) defining the positions of the inner and outer radial datum points on the basis of the measurements from step (I). In step (ii), the apex of the conical surface can then be positioned such that it is co-linear with the inner and outer radial datum points defined in step (II).

In a fourth aspect, the present invention provides a guide vane formation designed according to the method of the first aspect. For example, the fourth aspect can provide a guide vane formation for use in a gas turbine engine which has a cascade of circumferentially arranged identical guide vane formations, and which further has radially inner and radially outer support rings for the guide vane formations, each vane formation including radially inner and outer platforms which define, in use, the gas annulus of the engine, each vane formation further including at least one or more aerofoil bodies which each spans the platforms, wherein, in respect of each vane formation:

the inner and the outer platforms have respective inner and outer chordal seals which each extend in a straight line between circumferentially spaced side faces of the respective platform, the inner and outer chordal seals making respective sealing contacts with the inner and outer support rings such that the vane formation can pivot at the inner and outer chordal seals while maintaining the sealing contacts, the inner and outer chordal seals being parallel to but axially offset from each other; and each end of each chordal seal coincides with an end of the circumferentially adjacent chordal seal of the neighbouring vane formation.

In the guide vane formation, one of the side faces of the inner platform and one of the side faces of the outer platform are on the suction side of the aerofoil bodies, and the other side face of the inner platform and the other side face of the outer platform are on the pressure side of the aerofoil bodies. The side faces on the suction side may then be coplanar with each other, and the side faces on the pressure side may be coplanar with each other.

The guide vane formation may be a high-pressure turbine nozzle guide vane formation.

In a fifth aspect, the present invention provides a gas turbine engine having a cascade of circumferentially arranged identical guide vane formations according to the fourth aspect.

Further aspects of the present invention provide: a computer program comprising code which, when run on a computer, causes the computer to perform the method of the first aspect; a computer readable medium storing a computer program comprising code which, when run on a computer, causes the computer to perform the method of the first aspect; and a computer system programmed to perform the method of the first aspect. The term "computer readable medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" includes, but is not limited to portable or fixed storage devices, optical storage devices, wireless channels and various other mediums capable of storing, containing or carrying instruction(s) and/or data.

For example, a computer system can be provided for designing a guide vane formation for use in a gas turbine engine which has a cascade of circumferentially arranged identical guide vane formations, and which further has radially inner and radially outer support rings for the guide vane formations, each vane formation including radially inner and outer platforms which define the gas annulus of the engine, each vane formation further including one or more aerofoil bodies which each spans the platforms, the inner and the outer platforms of each vane formation having respective inner and outer chordal seals which each extend in a straight line between circumferentially spaced side faces of the respective platform, the inner and outer chordal seals of each vane formation making respective sealing contact with the inner and outer support rings such that the vane formation can pivot at the inner and outer chordal seals while maintaining the sealing contacts, the system including:

one or more processors configured to perform the steps of:

(i) receiving input values for selected relative axial positions of the inner and outer chordal seals such that the inner chordal seals of the vane formations lie in one normal plane to the engine centre line, and the outer chordal seals of the vane formations lie in another normal plane to the engine centre line;

(ii) receiving input values for selected radial heights of the inner and outer chordal seals, each radial height being the distance of closest radial approach of the respective chordal seal to the engine centre line;

(iii) defining inner and outer radial datum points for the inner and outer chordal seals, each radial datum point being on the respective normal plane and being at the respective radial height, and the inner and outer radial datum points being on a common plane which also contains the engine centre line;

(iv) defining a conical surface which is coaxial with the engine centre line, and which has a cone angle which determines the acute wedge angle formed on the gas-washed surface of each platform between a side face of that platform and the front or rear face of that platform, the apex of the conical surface being positioned such that it is co-linear with the inner and outer radial datum points;

(v) defining two segment planes which both contain the engine centre line and which have an angle between them measured around the centre line which is equal to 360° divided by the number of vane formations in the cascade;

(vi) defining two wedge chock planes which are each perpendicular to a respective segment plane and are each tangential to the conical surface, the side faces of the inner and outer platforms on the suction side of the aerofoil bodies of a vane formation lying in one of the wedge chock planes, and the side faces of the inner and outer platforms on the pressure side of the aerofoil bodies of the same vane formation lying in the other wedge chock plane; and (vii) defining, in the normal plane of a first one of the inner and outer chordal seals, (a) an arc of a circle which is centred on the engine centre line and contains the respective radial datum point, and (b) a tangent line to the arc such that the intersections of the tangent line with the wedge chock planes are at equal radial distances from the engine centre line, whereby the tangent line is the straight line of the first chordal seal, and whereby the straight line of the second chordal seal lies the other normal plane, is parallel to the straight line of the first chordal seal and provides the radial height of the second chordal seal. The system thus corresponds to the method of the first aspect. The system may further include a computer-readable medium or media operatively connected to the processors, the medium or media storing the geometry of the guide vane formation. The system may further include a display device for displaying the guide vane formation.

Further optional features of the invention are set out below.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES OF THE INVENTION

Figure 4:
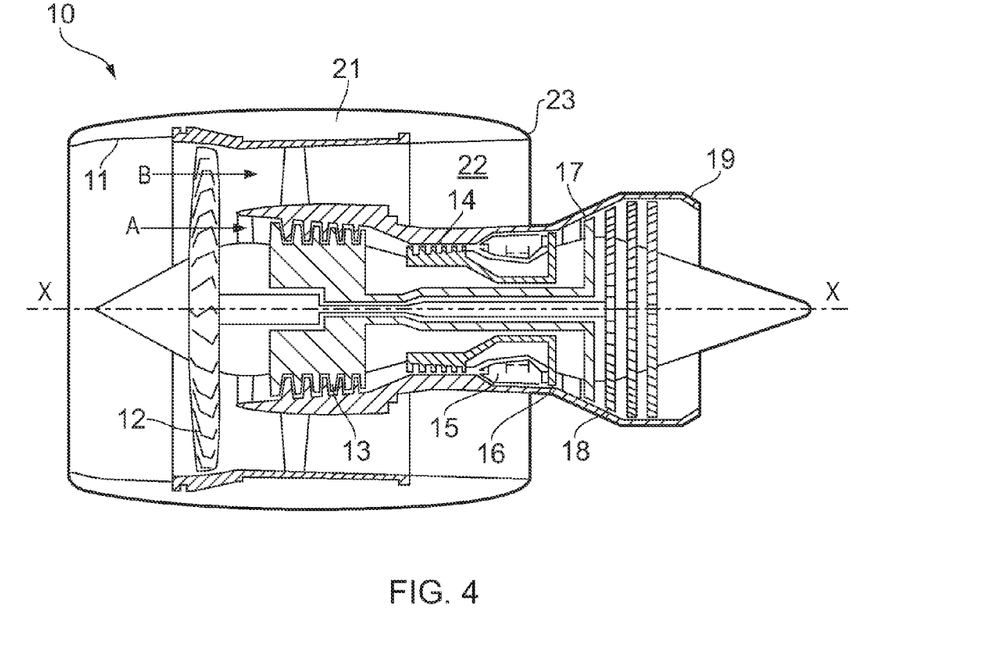
FIG. 4 shows schematically a cross-section through a ducted fan gas turbine engine.

With reference to FIG. 4, a ducted fan gas turbine engine incorporating the invention is generally indicated at 10 and has a principal and rotational axis X-X. The engine comprises, in axial flow series, an air intake 11, a propulsive fan 12, an intermediate pressure compressor 13, a high-pressure compressor 14, combustion equipment 15, a high-pressure turbine 16, an intermediate pressure turbine 17, a low-pressure turbine 18 and a core engine exhaust nozzle 19. A nacelle 21 generally surrounds the engine 10 and defines the intake 11, a bypass duct 22 and a bypass exhaust nozzle 23.

During operation, air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines respectively drive the high and intermediate pressure compressors 14, 13 and the fan 12 by suitable interconnecting shafts.

The engine 10 has a cascade of HPT NGV formations at the exit of the combustion equipment 15 and upstream of the high-pressure turbine 16. Conventionally it was thought to be impossible to match the polygon corners at both the inner and outer chordal seals of these formations, due to the platform wedge angle, unless the chordal seals were at the same axial position. However the method of present invention allows the wedge angle to be altered to achieve matched polygon corners on both the inner and outer chordal lines.

Figure 5:
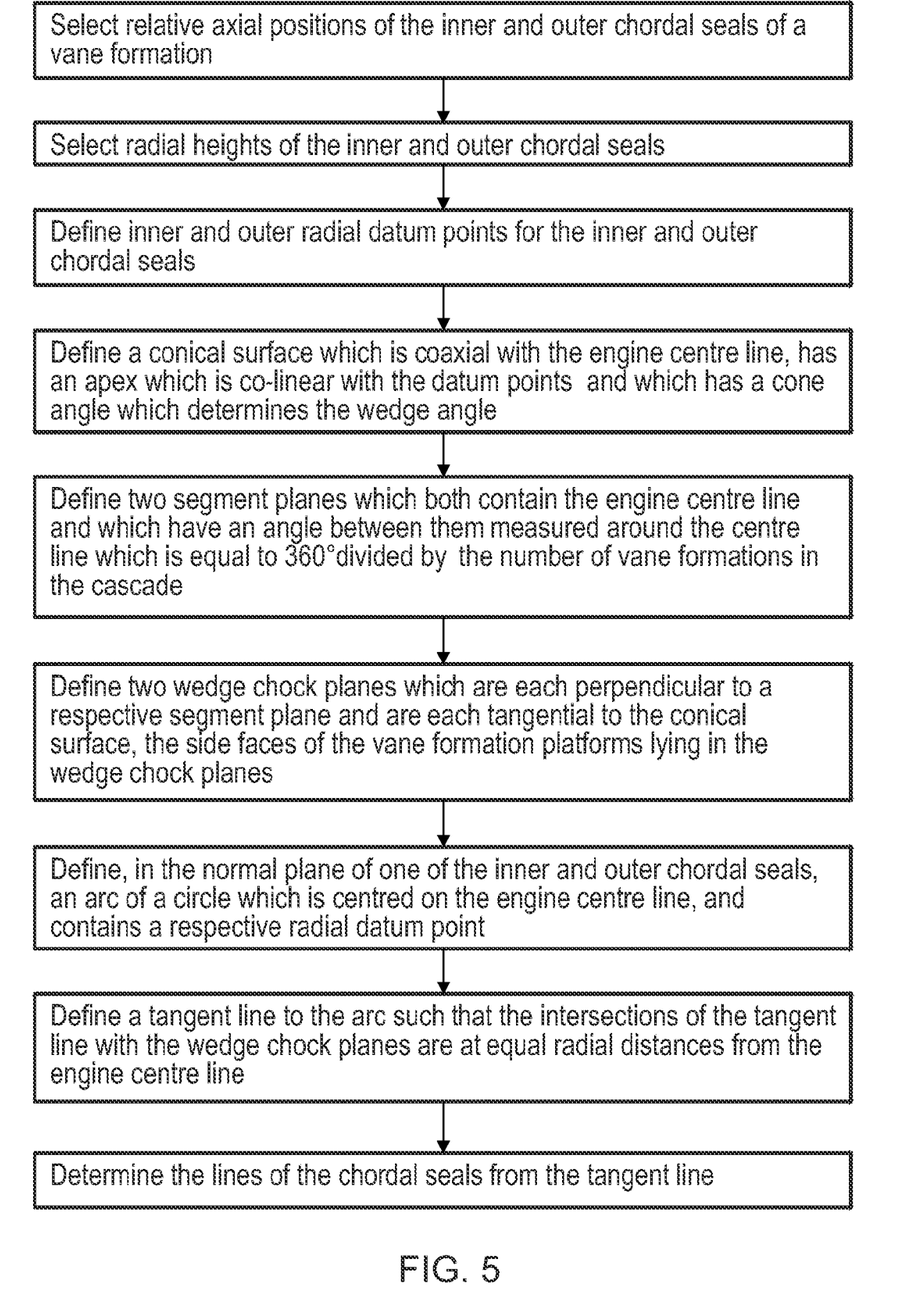
FIG. 5 shows a flow chart of a guide vane formation design method.

The method, which is typically performed on a computer system having suitable processors and memory to represent and manipulate the geometry of the NGV formations and having a display to show the relevant geometry, proceeds in stages, as indicated in the flow chart of FIG. 5. The computer system may have geometry modelling software such as a commercial CAD package.

Figure 6:
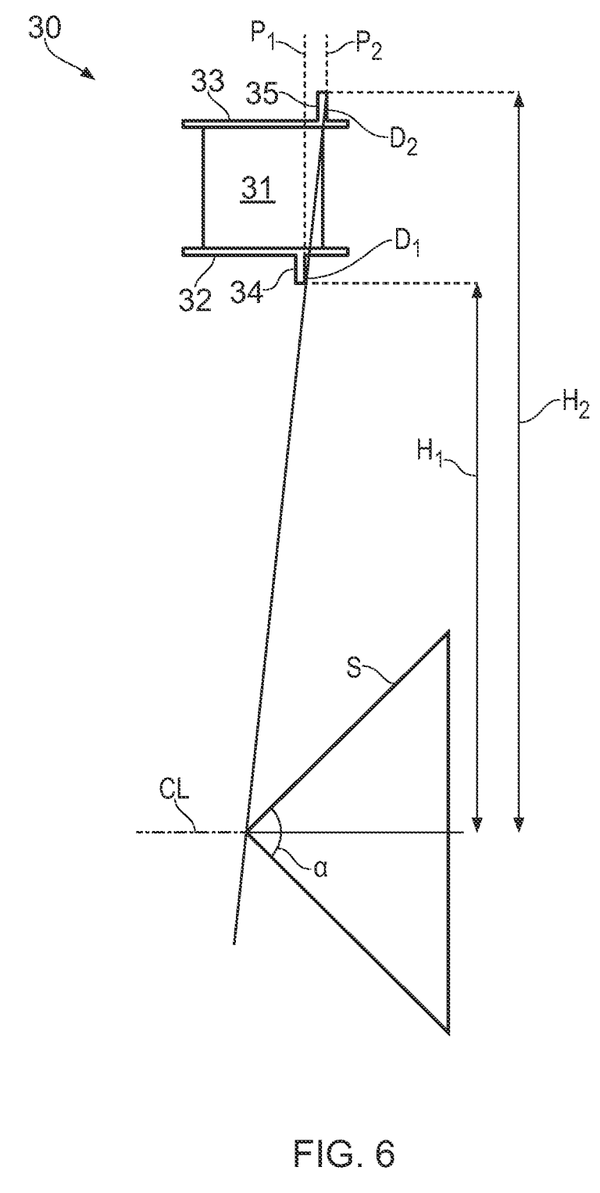
FIG. 6 shows schematically an engine centre line, a cross-sectional view of a guide vane formation, and a conical surface construct.

FIG. 6 shows schematically an engine centre line CL and a cross-sectional view of a guide vane formation 30 having one or more aerofoil bodies 31 and inner 32 and outer 33 platforms. Inner 34 and outer 35 chordal seals each extend in a straight line into the plane of the drawing (but not necessarily perpendicular thereto) between circumferentially spaced side faces of the respective platform.

In a first stage, the relative axial positions of the chordal seals are selected. The inner chordal seals 34 lie in a first plane $P_1$ (indicated by a dashed line in FIG. 6) normal to the engine centre line CL, and outer chordal seals 35 lie in a second plane $P_2$ (also indicated by a dashed line in FIG. 6) normal to the engine centre line CL but typically axially offset from the first plane.

Next, the respective radial heights $H_1$, $H_2$ of the inner 34 and outer 35 chordal seals are selected. As shown in FIG. 6, each radial height is the distance of closest radial approach of the respective chordal seal to the engine centre line.

The radial heights $H_1$, $H_2$ are then used to define inner $D_1$ and outer $D_2$ radial datum points for the inner 34 and outer 35 chordal seals. Each radial datum point is on the respective normal plane $P_1$, $P_2$, and is at the respective radial height $H_1$, $H_2$. Further, the radial datum points are on a common plane which also contains the engine centre line CL. Thus, in FIG. 6, the common plane is the plane of the drawing.

Next a conical surface S is defined which is coaxial with the engine centre line. The apex of the conical surface is positioned such that it is co-linear with the inner $D_1$ and outer $D_2$ radial datum points. The conical surface has a cone angle α which (as explained below) determines the acute wedge angle formed on the gas-washed surface of each platform 32, 33 between each side face of that platform and the front or rear face of that platform. More particularly, the value of the cone half angle α/2 is approximately the same as the value of the wedge angle.

Figure 7:
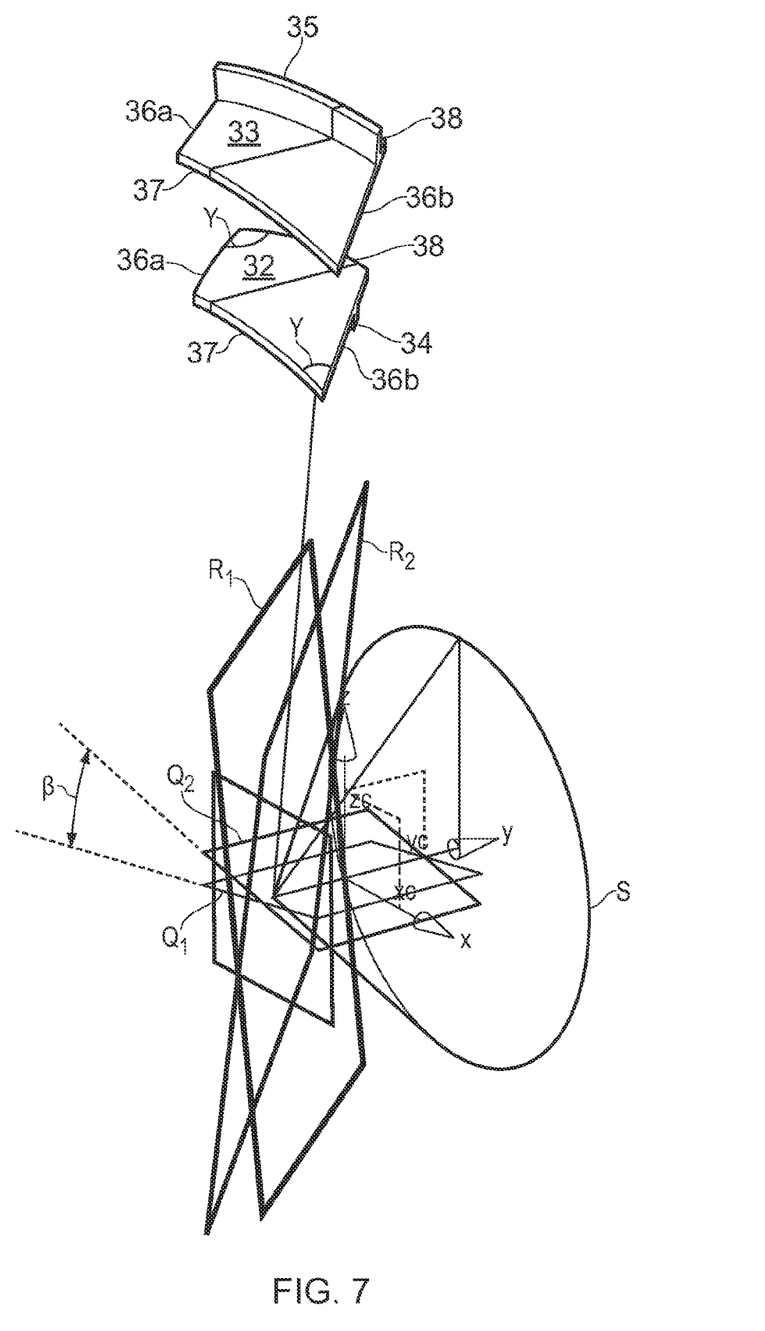
FIG. 7 shows schematically a perspective view of inner and outer platforms of the guide vane formation of FIG. 6, and the conical surface construct.
Figure 8:
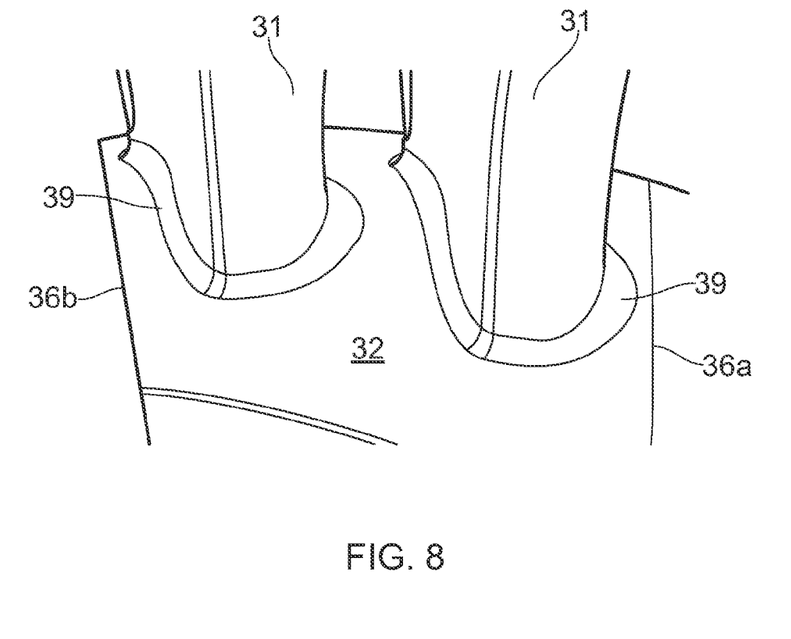
FIG. 8 shows a perspective view of an inner platform of a guide vane formation.

Two segment planes $Q_1$, $Q_2$ are also defined. These are illustrated in FIG. 7, which shows schematically a perspective view of the inner 32 and outer 33 platforms and the conical surface S, the platforms having side 36a, b, front 37 and rear 38 faces, and acute wedge angles γ being formed on the gas-washed surfaces of both platforms between each side face and the front or rear face (only the wedge angles for the inner platform are shown in FIG. 7). The segment planes both contain the engine centre line CL, and have an angle β between them measured around the centre line which is equal to 360° divided by the number of vane formations in the cascade. The relative angular position of the segment planes around the centre line ultimately determines the relative angular positions of the side faces 36 around the centre line. Thus the segment planes can be rotated around to centre line (while preserving the angle β between them) to ensure that the one or more aerofoil bodies 31 of each guide vane formation 30 do not over-hang its side faces, as illustrated in FIG. 8 which shows a perspective view of the inner platform 32 of an guide vane formation 30 having two aerofoil bodies 31, the joining fillets 39 of the aerofoil bodies to the platform being within and spaced from the side faces 36a, 36b.

Next two wedge chock planes $R_1$, $R_2$ which are each perpendicular to a respective segment plane $Q_1$, $Q_2$ and are each tangential to the conical surface S are defined. The side faces 36a of the inner 32 and outer 33 platforms on the suction side of the one or more aerofoil bodies 31 of the guide vane formation 30 are required to lie in the wedge chock plane $R_1$, and the side faces 36b of the inner and outer platforms on the pressure side are required to lie in the wedge chock plane $R_2$. By this construction: the value of the cone half angle α/2 is translated into the value of the wedge angle γ; the value of the angle β between the segment planes $Q_1$, $Q_2$ is translated into the angular distance around the centre line CL between the side faces 36a, b of a given platform; both the side faces 36a on the suction side become coplanar; and both the side faces 36b on the pressure side become coplanar.

Figure 9:
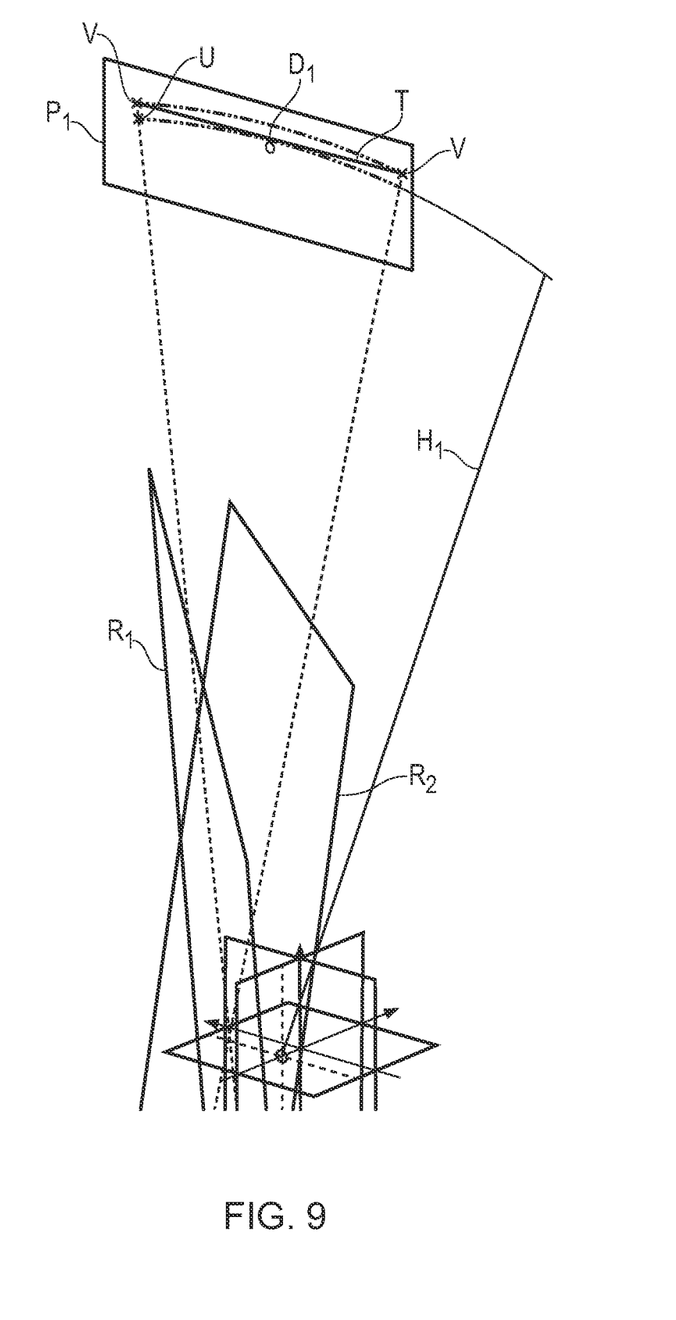
FIG. 9 shows schematically a determination of the line of an inner chordal seal.

Next the line of one of the chordal seals 34, 35 is determined. This can be either the inner or the outer chordal, as the line of the other chordal seal will be parallel. For illustrative purposes, FIG. 9 shows schematically the determination of the line of the inner chordal seal 34, but the approach would be the same for the outer chordal seal 35. Thus, an arc U is defined in the normal plane $P_1$ for the inner chordal seal. The arc is centred on the centre line CL and contains the radial datum point $D_1$. A tangent line T to the arc U is then defined with the intersections V of the tangent line T with the wedge chock planes $R_1$, $R_2$ being at equal radial distances (greater than the radial height $H_1$) from the centre line.

The tangent line T thus determined is the straight line of the inner chordal seal 34. By requiring the intersections V to be at equal radial distances "saw-tooth" leakage gaps can be eliminated for neighbouring inner chordal seals. The straight line of the outer chordal seal 35 lies in the normal plane $P_2$, is parallel to the straight line of the inner chordal seal, and provides the radial height $H_2$ of the second chordal seal. "Saw-tooth" leakage gaps are thus also eliminated for neighbouring outer chordal seals.

Figure 10:
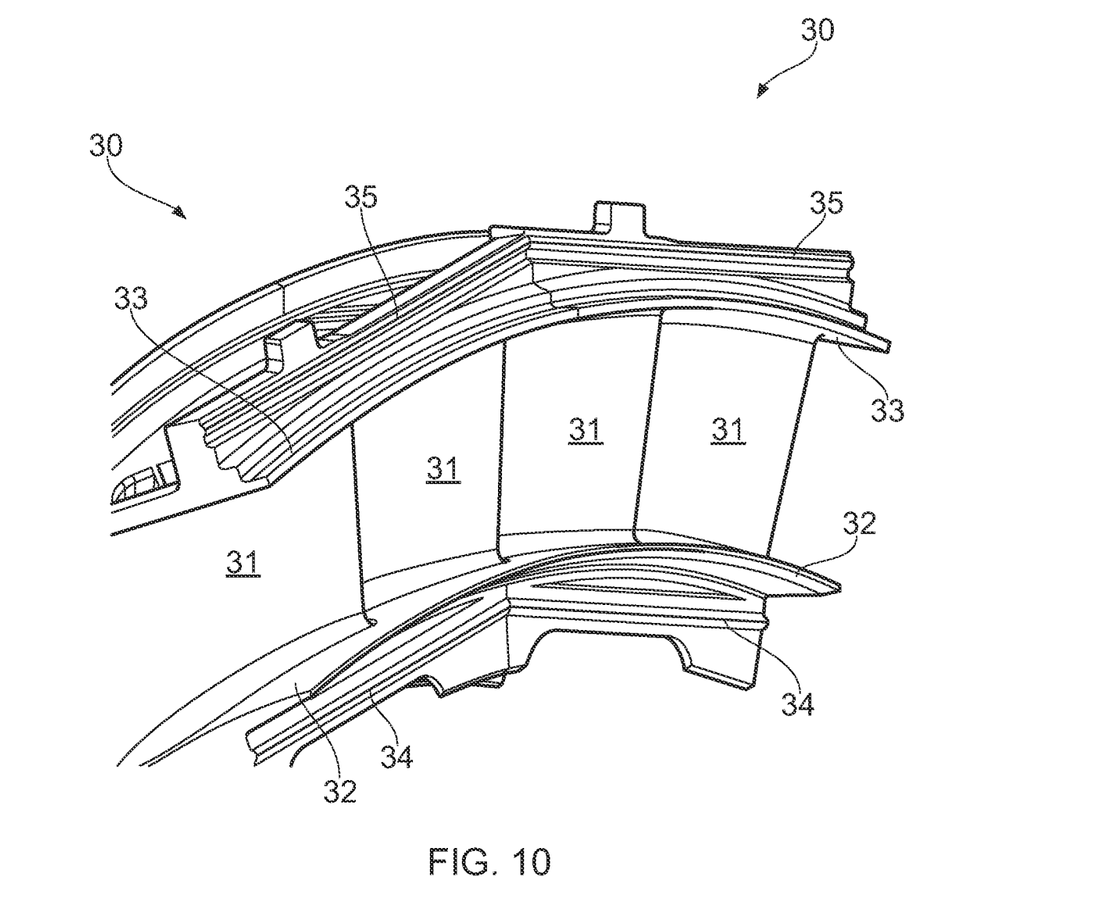
FIG. 10 shows a view from the rear of two neighbouring nozzle guide vane formations.

FIG. 10 shows a view from the rear of two neighbouring NGV formations 30 designed according to this method. Again, each formation has two aerofoil bodies 31. The inner 34 and outer 35 chordal seals are axially offset from each other. However, the side faces of the inner 32 and outer 33 platforms at each side of the formations are coplanar, and between the neighbouring formation there is zero mis-match between the ends of both the inner 34 and the outer 35 chordal seals. As there are no "saw-tooth" leakage gaps, substantial engine efficiency improvements can thus be obtained.

The methodology described above can also be used to adjust the design of NGV formations in existing engine designs in order reduce or eliminate "saw-tooth" leakage gaps. In particular, in existing engine designs, although the positions of the chordal seals may be fixed by the design, it can be possible to vary the positions of the side faces of the inner and outer platforms. For example, the NGV formations can be manufactured with oversized inner and outer platforms, which can then be finish machined to locate the side faces in final positions which provide improved leakage characteristics. In such an example, the methodology can be adapted to accept measured values of the positions of the normal planes $P_1$, $P_2$, and the radial heights $H_1$, $H_2$. The two segment planes $Q_1$, $Q_2$ are then rotated while preserving the angle β between them. This has the effect of correspondingly rotating the wedge chock planes $R_1$, $R_2$ which define the final positions of the side faces of the inner and outer platforms. The oversized inner and outer platforms can then be machined to produce finished side faces at the final positions. Although it may not be possible to entirely eliminate "saw-tooth" leakage gaps in this way, they can generally be reduced.

While the invention has been described in conjunction with the exemplary embodiments described above, many equivalent modifications and variations will be apparent to those skilled in the art when given this disclosure. For example, the approach can be applied to eliminate leakage gaps in chordal seals of other guide vane formations, not just HPT NGVs. Further, although the flowchart may describe the stages of the method as a sequential process, many of the stages can be performed in parallel or concurrently. In addition, the order of the operations may be re-arranged. Accordingly, the exemplary embodiments of the invention set forth above are considered to be illustrative and not limiting. Various changes to the described embodiments may be made without departing from the spirit and scope of the invention.

The invention claimed is:

1. A computer-based method of designing a guide vane formation for use in a gas turbine engine, the gas turbine engine including a cascade of circumferentially arranged identical guide vane formations and radially inner and radially outer support rings for the guide vane formations, each of the guide vane formations including radially inner and outer platforms that define a gas annulus of the gas turbine engine, and each of the guide vane formations including one or more aerofoil bodies that each spans a respective platform of the inner and outer platforms, the inner and the outer platforms of each of the guide vane formations having respective inner and outer chordal seals that each extend in a straight line between circumferentially spaced side faces of a respective platform of the inner and outer platforms, and the inner and outer chordal seals of each of the guide vane formations making respective sealing contact with the inner and outer support rings such that the each of the guide vane formations can pivot at the inner and outer chordal seals while maintaining the sealing contacts, the method comprising:
(i) selecting relative axial positions of the inner and outer chordal seals such that the inner chordal seals of the guide vane formations lie in one normal plane to an engine centre line of the gas turbine engine, and the outer chordal seals of the guide vane formations lie in another normal plane to the engine centre line;
(ii) selecting radial heights of the inner and outer chordal seals, each radial height being a distance of closest radial approach of a respective chordal seal of the inner and outer chordal seals to the engine centre line;
(iii) defining inner and outer radial datum points for the inner and outer chordal seals, each radial datum point being on a respective normal plane of the normal planes and being at a respective radial height of the radial heights, and the inner and outer radial datum points being on a common plane that also contains the engine centre line;
(iv) defining a conical surface that is coaxial with the engine centre line, and that has a cone angle that determines an acute wedge angle formed on a gas-washed surface of each platform of the inner and outer platforms between a side face of a respective platform of the inner and outer platforms and a front or rear face of the respective platform of the inner and outer platforms, an apex of the conical surface being positioned such that the apex is co-linear with the inner and outer radial datum points;
(v) defining two segment planes that both contain the engine centre line and that have an angle between the two segment planes measured around the engine centre line that is equal to 360° divided by the number of guide vane formations in the cascade;
(vi) defining two wedge chock planes that are each perpendicular to a respective segment plane and that are each tangential to the conical surface, the side faces of the inner and outer platforms on a suction side of the one or more aerofoil bodies of a guide vane formation lying in one of the wedge chock planes, and the side faces of the inner and outer platforms on a pressure side of the one or more aerofoil bodies of the same guide vane formation lying in the other wedge chock plane;
(vii) defining, in the normal plane of a first one of the inner and outer chordal seals, (a) an arc of a circle that is centred on the engine centre line and contains a respective radial datum point of the inner and outer radial datum points, and (b) a tangent line to the arc such that intersections of the tangent line with the wedge chock planes are at equal radial distances from the engine centre line, whereby the tangent line is the straight line of the first chordal seal, and whereby the straight line of the second chordal seal lies on the other normal plane, is parallel to the straight line of the first chordal seal and provides the radial height of the second chordal seal; and
(viii) forming the guide vane formation based on steps (i) through (vii).

2. The method according to claim 1, wherein the normal planes are axially offset from each other.

3. The method according to claim 1, further including, after step (v), the step of:
rotating the two segment planes about the engine centre line, the rotation preserving the angle between the segment planes and resulting in a corresponding rotation of the two wedge chock planes.

4. The method according to claim 1, wherein the normal planes are axially offset from each other, and further including, after step (v), the step of:
rotating the two segment planes about the engine centre line, the rotation preserving the angle between the segment planes and resulting in a corresponding rotation of the two wedge chock planes.

5. The method according to claim 1, wherein the inner and outer chordal seals are parallel to but axially offset from each other, and each end of each chordal seal of the inner and outer chordal seals coincides with an end of the circumferentially adjacent chordal seal of the neighbouring vane formation.

6. The method according to claim 5, wherein the formed guide vane formation is a high-pressure turbine nozzle guide vane formation, the side faces on the suction side are coplanar with each other, and the side faces on the pressure side are coplanar with each other.

7. A gas turbine engine having a cascade of circumferentially arranged identical guide vane formations according to claim 5.

8. The method according to claim 1, wherein the side faces on the suction side are coplanar with each other, and the side faces on the pressure side are coplanar with each other.

9. The method according to claim 1, wherein the formed guide vane formation is a high-pressure turbine nozzle guide vane formation.

10. A gas turbine engine having a cascade of circumferentially arranged identical guide vane formations according to claim 1.

11. A method of producing a guide vane formation for use in a gas turbine engine, the gas turbine engine including a cascade of circumferentially arranged identical guide vane formations and radially inner and radially outer support rings for the guide vane formations, the method comprising:
(i) providing a guide vane formation that includes radially inner and outer platforms that define a gas annulus of the gas turbine engine, and one or more aerofoil bodies that each spans a respective platform of the inner and outer platforms, the inner and the outer platforms of each guide vane formation having respective inner and outer chordal seals that each extend in a straight line between circumferentially spaced provisional side faces of a respective platform of the inner and outer platforms, in use the inner and outer chordal seals of each guide vane formation making respective sealing contact with the inner and outer support rings such that the guide vane formation can pivot at the inner and outer chordal seals while maintaining the sealing contacts, the inner and outer chordal seals having:
- (a) relative axial positions such that the inner chordal seals of the guide vane formations lie in one normal plane to an engine centre line of the gas turbine engine, and the outer chordal seals of the guide vane formations lie in another normal plane to the engine centre line,
- (b) radial heights, each radial height being a distance of closest radial approach of the respective chordal seal to the engine centre line, and
- (c) inner and outer radial datum points, each radial datum point being on a respective normal plane of the normal planes and being at a respective radial height of the radial heights, and the inner and outer radial datum points being on a common plane that also contains the engine centre line;

(ii) defining a conical surface that is coaxial with the engine centre line, and that has a cone angle that determines an acute wedge angle formed on a gas-washed surface of each platform of the inner and outer platforms between a final position a side face of a respective platform of the inner and outer platforms and a front or rear face of the respective platform of the inner and outer platforms, an apex of the conical surface being positioned such that the apex is co linear with the inner and outer radial datum points;

(iii) defining two segment planes that both contain the engine centre line and that have an angle between the two segment planes measured around the engine centre line that is equal to 360° divided by the number of guide vane formations in the cascade;

(iv) defining two wedge chock planes that are each perpendicular to a respective segment plane of the segment planes and that are each tangential to the conical surface, final positions of the side faces of the inner and outer platforms on a suction side of the one or more aerofoil bodies of the guide vane formation lying in one of the wedge chock planes, and the final positions of the side faces of the inner and outer platforms on a pressure side of the one or more aerofoil bodies of the guide vane formation lying in the other wedge chock plane;

(v) rotating the segment planes about the engine centre line, the rotation preserving the angle between the segment planes, in order to adjust the positions of the wedge chock planes and the corresponding final positions of the side faces such that sawtooth leakage gaps of the inner and outer chordal seals are reduced or eliminated; and (vi) machining the provisional side faces of the guide vane formation to produce finished side faces at the final positions.

12. A gas turbine engine having a cascade of circumferentially arranged identical guide vane formations according to claim 11.

\* \* \* \* \*